United States Patent
Seto

[11] Patent Number: 6,036,425
[45] Date of Patent: Mar. 14, 2000

[54] COMPONENT-FEEDING DEVICE IN ELECTRONIC COMPONENT-MOUNTING APPARATUS

[75] Inventor: Katsuyuki Seto, Gunma-ken, Japan

[73] Assignee: Sanyo Electric Co., Ltd, Osaka-fu, Japan

[21] Appl. No.: 09/047,036

[22] Filed: Mar. 24, 1998

[30] Foreign Application Priority Data

Mar. 27, 1997 [JP] Japan ................................. 9-093029

[51] Int. Cl.⁷ .................................................. B65G 1/00
[52] U.S. Cl. ........................ 414/277; 414/280; 414/286; 414/222.07
[58] Field of Search .................................. 414/273, 277, 414/280, 286, 416, 222.07; 29/740, 741, 759

[56] References Cited

U.S. PATENT DOCUMENTS

| | | | |
|---|---|---|---|
| 5,120,178 | 6/1992 | Ito | 414/222.07 |
| 5,153,983 | 10/1992 | Oyama . | |
| 5,213,463 | 5/1993 | Rothlisberger et al. | 414/280 |
| 5,295,294 | 3/1994 | Ito . | |
| 5,380,138 | 1/1995 | Kasai et al. | 414/277 |
| 5,551,821 | 9/1996 | Hall | 414/280 X |
| 5,626,453 | 5/1997 | Bouché | 414/280 |
| 5,626,454 | 5/1997 | Tokiwa et al. | 414/280 |
| 5,672,040 | 9/1997 | Kimura et al. | 414/416 X |
| 5,692,867 | 12/1997 | Kondo et al. | 414/416 X |
| 5,829,942 | 11/1998 | Beers | 414/280 X |

FOREIGN PATENT DOCUMENTS

| | | | |
|---|---|---|---|
| 3612008 | 10/1986 | Germany | 414/280 |
| 4-182204 | 6/1992 | Japan | 414/280 |
| 04241498 | 8/1992 | Japan . | |
| 1175810 | 8/1985 | U.S.S.R. | 414/280 |
| 1450963 | 1/1989 | U.S.S.R. | 414/280 |
| WO97/20455 | 6/1997 | WIPO . | |

Primary Examiner—Gregory A. Morse
Attorney, Agent, or Firm—Darby & Darby

[57] ABSTRACT

There is provided a component-feeding device for an electronic component-mounting apparatus which has a main block for carrying out electronic component-pickup and mounting operations. The component-feeding device selectively transports a plurality of pallets on each of which at least one tray containing a number of electronic components is placed, to a pickup position for picking up supplied one of the electronic components. A selected one of the pallets is vertically transported selectively to different levels according to a height of the at least one tray on the selected one of the pallets. The selected pallet vertically transported to the selected level is horizontally transported to the pickup position.

7 Claims, 5 Drawing Sheets

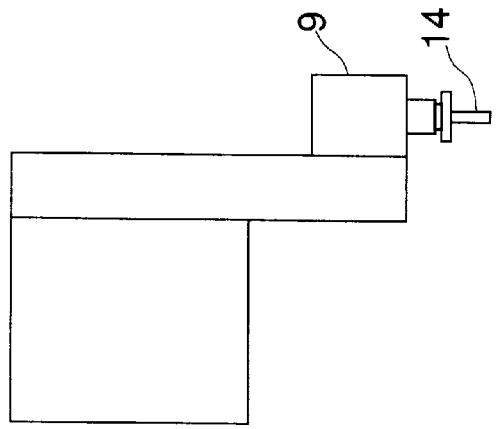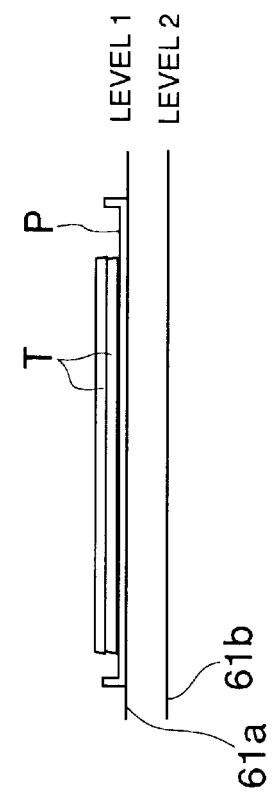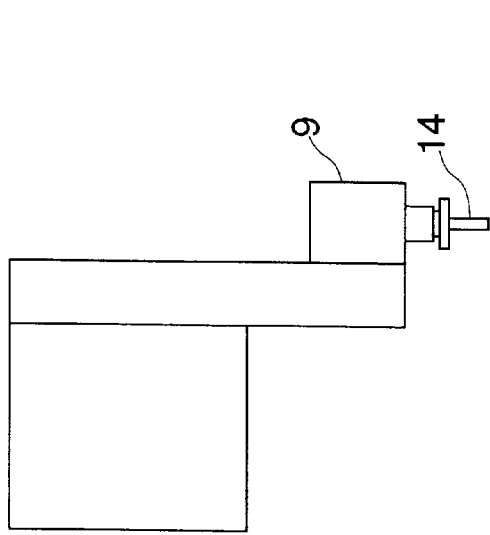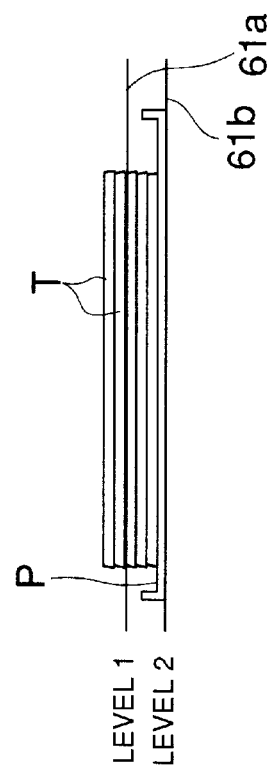
FIG. 4A
FIG. 4B

COMPONENT-FEEDING DEVICE IN ELECTRONIC COMPONENT-MOUNTING APPARATUS

BACKGROUND OF THE INVENTION

1. Field of the Invention

This invention relates to a component-feeding device in an electronic component-mounting apparatus of a multi-function type for mounting e.g. various kinds of supplied electronic components on a circuit board.

2. Prior Art

Conventionally, a component-feeding device of this kind is known which brings a pallet carrying thereon a single or a plurality of trays on which a lot of electronic components are juxtaposed to a pickup position of a main block of an electronic component-mounting apparatus to thereby directly feed electronic components to the main block of the apparatus. Such a component-feeding device is used for mainly feeding relatively large-sized electronic components, such as multi-lead components, and includes an elevating mechanism for lifting and lowering pallets each carrying trays thereon to selectively guide the pallets to the level of a transport passage of the main block of the apparatus, and a transport mechanism for drawing out the selected palette from the elevating mechanism to transport the same to the pickup position of the main block of the apparatus along the transport passage. Each pallet carrying the trays is set on the elevating mechanism and then lifted or lowered to the level of the transport passage to be horizontally sent to the pickup position of the main block of the apparatus by the transport mechanism. Each electronic component supplied to the pickup position is picked up and carried by a vacuum nozzle of each mounting head of the apparatus to a circuit board to be mounted thereon.

In the electronic component-mounting apparatus constructed as above, a reference level at which the mounting head carries the picked-up electronic component to the circuit board in the X-Y direction is limited by the level at which the component is supplied. More specifically, each pallet guided into the main block area of the apparatus is always set to the same level as the level of the transport passage, whereas the height of a tray(s) placed on the pallet varies with the height of electronic components juxtaposed on the tray(s). Therefore, the reference level of the mounting head is set in a manner such that the vacuum nozzle of the mounting head does not interfere with large-height trays (containing large-height electronic components).

As a result, in the conventional component-feeding device, when the tray(s) is/are guided to the pickup position by using each pallet, the difference in level between the top surface of a large-height tray and that of a small-height tray is increased with increase in the difference in height between the trays, and accordingly, except when most of the guided trays have a large height, the distance vertically traveled by the mounting head is increased resulting in an increased total tact time of mounting electronic components on each circuit board. One possible solution to this inconvenience is that the mounting head is once lifted before reaching a pallet in the pickup position only when a large-height tray is supplied i.e. carried on the pallet. This method, however, suffers from the inconvenience that the manner of control of the mounting head becomes complicated and the vacuum nozzle can be broken in case data or commands for this control are erroneously input.

SUMMARY OF THE INVENTION

It is the object of the invention to provide a component-feeding device for an electronic component-mounting apparatus, which is free from adverse effects of the height of trays on the tact time of mounting electronic components on each circuit board.

To attain the above object, the invention provides a component-feeding device for an electronic component-mounting apparatus having a main block for carrying out electronic component-pickup and mounting operations, the component-feeding device selectively transporting a plurality of pallets on each of which at least one tray containing a number of electronic components is placed, to a pickup position in the main block for picking up supplied one of the electronic components.

The component-feeding device according to the invention is characterized by comprising:

vertical transport means for vertically transporting a selected one of the pallets selectively to different levels according to a height of the at least one tray on the selected one of the pallets; and horizontal transport means for horizontally transporting the selected pallet from the vertical transport means to the pickup position.

According to this component-feeding device, the vertical transport means transports a selected pallet according to the height of a tray carried on the pallet such that if the (at least one) tray has a large height, it is carried to a lower level, whereas if the same has a small height, the it is carried to a higher level. Therefore, the difference in level between the top surface of a large-height tray carried on a pallet to the pick up position and that of a small-height tray carried on a pallet to the pickup position can be reduced, which makes it possible to decrease the distance over which the mounting head is required to vertically travel to pick up an electronic component.

Preferably, the vertical transport means has a vertical transport mechanism for vertically transporting the selected pallet, a controller for controlling operation of the vertical transport mechanism, and a height-detecting device for detecting the height of the at least one tray on the selected pallet from a top surface of the selected pallet, and the controller causes the vertical transport mechanism to operate based on a result of the detection by the height-detecting device.

According to this preferred embodiment, the height of the tray(s) on the pallet is detected, and based on results of the detection, the vertical transport mechanism is operated, whereby it is possible to automatically transport the pallet to a proper one of the levels dependent the height of the tray(s) and thereby bring the same to the pickup position. Further, the height of the tray(s) is not manually input as data or commands for the control, but actually detected by the height-detecting device, whereby errors in inputting the data or commands can be precluded.

Preferably, the horizontal transport means has a plurality of transport means having respective transport passages corresponding to the different levels.

More preferably, the component-feeding device includes a pallet storage device for storing the plurality of pallets, the pallet storage device having a plurality of shelves arranged in a vertically-spaced manner, the height-detecting device being arranged at a predetermined location on the vertical transport means where the selected pallet passes when the selected pallet is transferred from the pallet storage device to the vertical transport means, for detecting the height of the at least one tray on the selected pallet.

Further preferably, the vertical transport mechanism comprises a transfer device and a lift mechanism for lifting and lower the transfer device, the transfer device having a belt conveyor for receiving the selected pallet thereon and horizontally transporting the selected pallet received thereon.

Still more preferably, the belt conveyor has a protruding portion which can be selectively brought to an upright position and a flat retracted position, and when the transfer device pulls the selected pallet out of the pallet storage device, the protruding portion is set to the upright position for engagement with one end of the selected pallet, while when the selected pallet is transferred to the horizontal transport means, the protruding portion is set to the flat retracted position.

More preferably, each of the plurality of transport means of the horizontal transport means comprises an arm device for horizontally extending to advance and retracting to withdraw and a drive device for driving the arm device, the arm device having an end formed with a hook for engagement with one end of the selected pallet.

The above and other objects, features, and advantages of the invention will become more apparent from the following detailed description taken in conjunction with the accompanying drawings.

BRIEF DESCRIPTION OF THE DRAWINGS

FIGS. 4A and 4B are diagrams which are useful in explaining the manner of suitably using "level 1" or "level 2" in dealing with trays arranged in stack.

DETAILED DESCRIPTION

The invention will now be described in detail with reference to the drawings showing an embodiment thereof.

Figure 1:
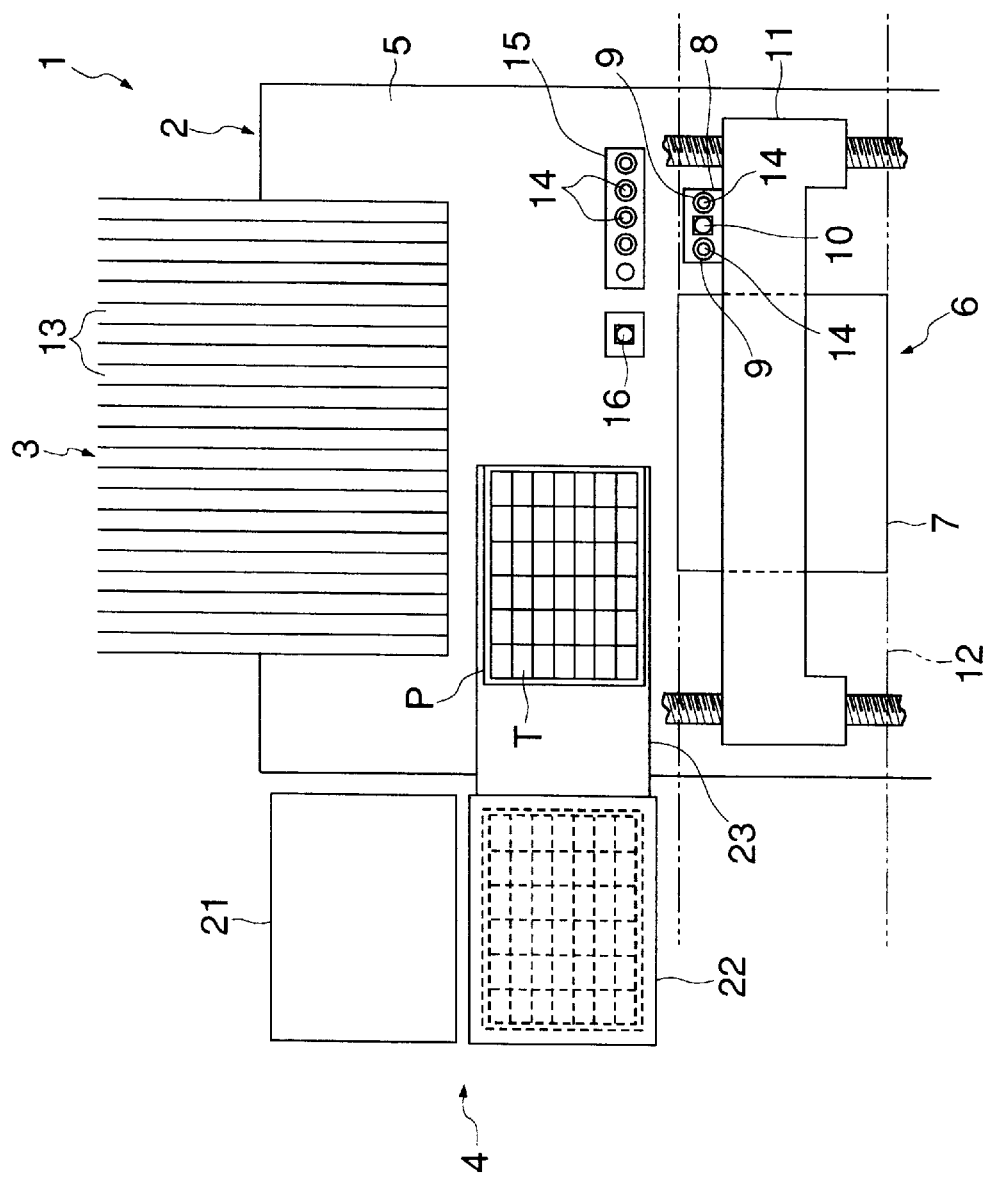
FIG. 1 is a plan view of an electronic component-mounting apparatus incorporating a component-feeding device according to an embodiment of the invention.

Referring first to FIG. 1, there is shown an electronic component-mounting apparatus incorporating a component-feeding device according to the embodiment of the invention, which is a so-called multi-function chip mounter used for mounting on circuit boards various kinds of electronic components, such as surface-mounting components including chip capacitors, chip resistances, etc., and multi-lead components of flat package ICs. The electronic component-mounting apparatus 1 includes a main block 2 of the apparatus for mounting supplied electronic components on a circuit board, a first electronic component feeder 3 for feeding small-sized electronic components, such as surface-mounting components, to the main block 2 of the apparatus, and a second electronic component feeder 4 for feeding large-sized electronic components, such as multi-lead components, to the main block 2 of the apparatus.

The main block 2 includes a base 5, a circuit board transfer device 6 having a table 7 arranged at a central portion of the base 5, a head unit 8 carrying two mounting heads 9 and a board-sensing camera 10, and an X-Y stage 11 for moving the head unit 8 in a X-Y direction. The mounting heads 9 are brought to the first electronic component feeder 3 or the second electronic component feeder 4 by operation of the X-Y stage 11 to pick up electronic components, and then mount the electronic components on the circuit board set on the table 7. When the above operation is repeatedly carried out to complete the mounting of the electronic components on the circuit board, the circuit board transfer device 6 sends forward the circuit board along a transfer passage 12 for conveying circuit boards, and thereafter a new circuit board is set on the table 7 in place of the delivered circuit board.

The first electronic component feeder 3 is comprised of a lot of cassette-type tape feeders 13 arranged in parallel with each other on one side of the base 5 in a direction perpendicular to the one side which is parallel to the transfer passage 12, such that each tape feeder 13 has a front end thereof facing toward a pickup position at which the mounting heads 9 pick up electronic components. Electronic components are contained in each tape feeder 13 in a state loaded on a carrier tape, not shown, to be fed from the front end of the tape feeder 13 one by one.

The second electronic component feeder 4 is arranged on another side of the base 5 at right angles to the one side of the base 5 on which the first component feeder 3 is arranged. In the second electronic component feeder 4, a lot of electronic components are juxtaposed in each of a single or a plurality of trays T carried on the pallet P. The pallet P is brought to the pickup position between the first electronic component feeder 3 and the setting table 7 to thereby supply the electronic components to the main block 2 of the apparatus.

On the other hand, each mounting head 9 has a vacuum nozzle 14 removably mounted on a lower end thereof, for picking up electronic components by vacuum. There are provided a plurality of kinds of vacuum nozzles for replacement according to the horizontal contour or the weight of electronic components to be picked up. In the present embodiment, vacuum nozzles 14 for replacement are contained in a nozzle storage device 15 arranged on the top of the base 5. In the nozzle storage device 15, a plurality of kinds of vacuum nozzles 14 to be used are positioned in parallel with each other.

Further, at a location near the nozzle storage device 15, there is arranged a component-sensing camera 16 for sensing or recognizing the position of each electronic component picked up by the vacuum nozzle 14. Before each electronic component picked up by the vacuum nozzle 14 is mounted on the circuit board, its amount of displacement from its proper position in an X direction, in a Y direction, and in a è direction (defined by a rotational angle of the electronic component on a horizontal plane) with respect to the axis of the vacuum nozzle 14 is detected by the component-sensing camera. And, based on the detected amount of displacement, the position in the è direction of each electronic component is corrected by the rotation of the vacuum nozzle 14 and the positions in the X direction and in the Y direction are corrected by the X-Y stage 11.

Figure 2:
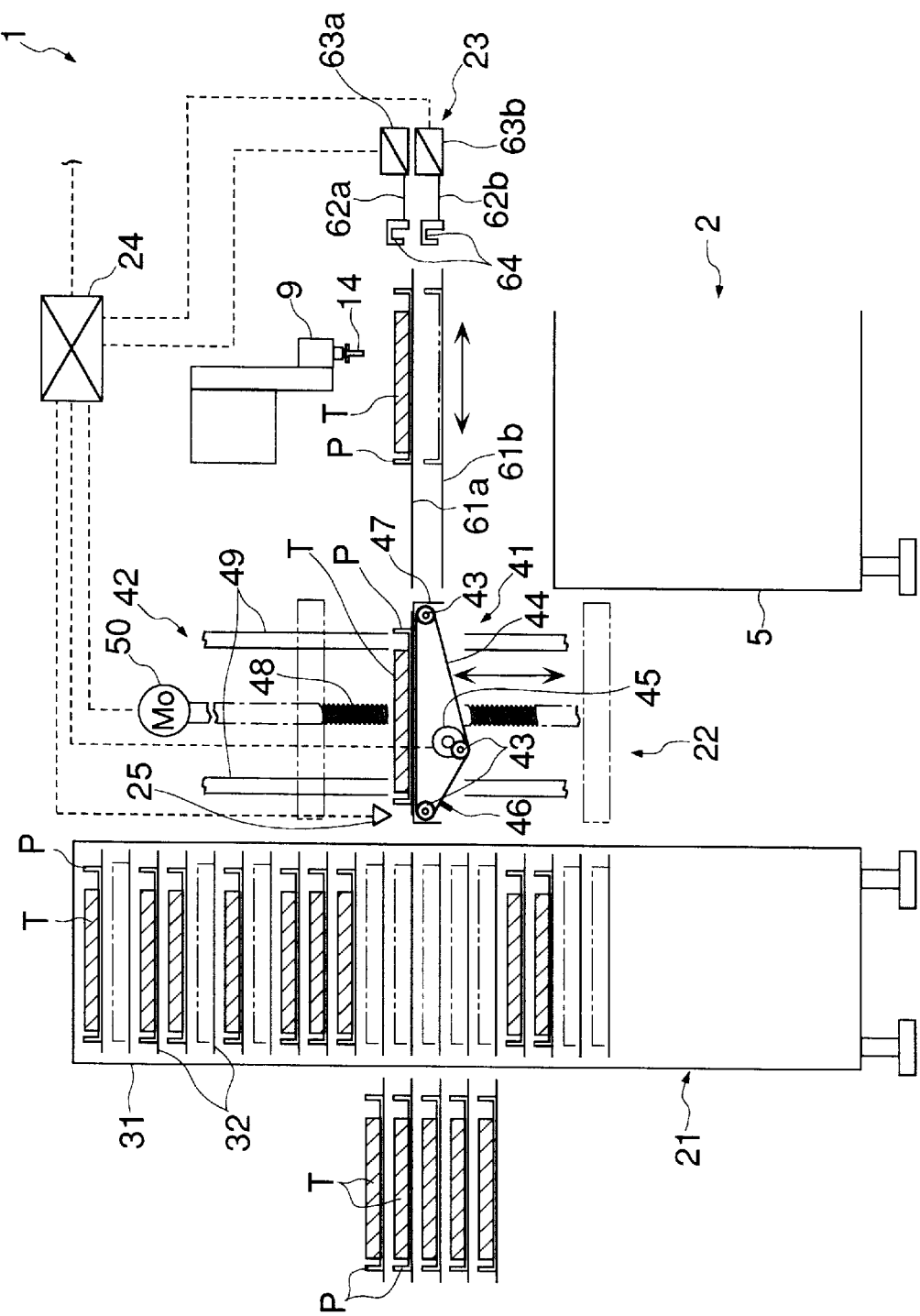
FIG. 2 is a side view of a second component-feeding device appearing in FIG. 1.

Next, the second electronic component feeder 4 will be described in detail with reference to FIGS. 1 and 2. The second electronic component feeder 4 is comprised of a pallet storage device 21 for holding a lot of pallets P in stock, an elevating mechanism (vertical transport means) 22 for selectively carrying each pallet P to and from the pallet storage device 21 as well as vertically moving the pallet P to a predetermined level, and a pallet guide device (horizontal transport means) 23 for horizontally moving the pallet P at the predetermined level from the elevating mechanism 22 to the pickup position of the main block of the apparatus 2.

The pallet storage device 21 is comprised of a cabinet 31, and a lot of shelves 32 arranged within the cabinet 21 in a vertically spaced manner for placing pallets P thereon. The cabinet 31 has a wide opening on a right-hand side thereof as viewed in FIG. 2, through which each pallet P is selectively moved to and from the elevating mechanism 22. Further, the cabinet 31 has a door, not shown, on a left-hand side thereof as viewed in FIG. 2, which is opened to carry in and out pallets P.

Figure 2A:
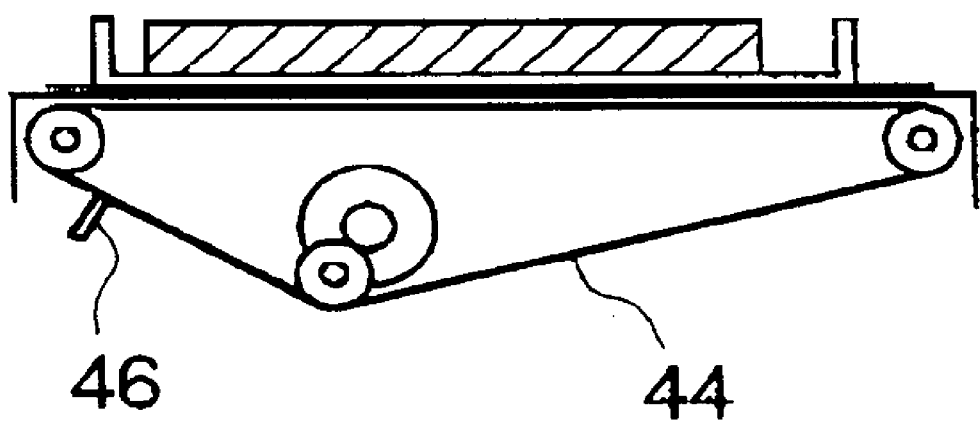
FIG. 2A is an enlarged view of a portion of FIG. 2.

The elevating mechanism 22 is comprised of a transport mechanism 41 for transporting each pallet P between the same and the pallet storage device 21, and a lift mechanism 42 for lifting and lowering the transport mechanism 41. The transport mechanism 41 includes three pulleys 43, 43, 43, an endless conveyor belt 44 stretched between the three pulleys 43, and a conveyor motor 45 connected to a central one of the pulleys 43. Further, on an outer surface of the conveyor belt 44, there are provided two projections 46 (only one is shown in FIG. 2A) which can be brought to an upright position or a flat position, at respective locations opposite to each other.

To transport each pallet P in the pallet storage device 21 to the elevating mechanism 22, the conveyor belt 44 is driven with each projection 46 brought to the upright position by a device, not shown. The projection 46 is moved round one of the pulleys 43 on the left-hand side as viewed in FIG. 2 and catches a desired one of the pallets P in the pallet storage device 21 (pallet P and the left-hand pulley 43 are actually close to each other). The conveyor belt 44 with the pallet P caught thereon makes half turn to thereby guide the pallet P onto the upper surface of the conveyor belt 44. Further, by a reversed procedure, the pallet P placed on the elevating mechanism 22 is carried into the pallet storage device 21. On the other hand, when the pallet P is guided from the elevating mechanism 22 to the main block of the apparatus 2 by the pallet guide device 23, or inversely, when the pallet P is returned from the main block of the apparatus 2 to the elevating mechanism 22, the above projections 46 are brought to the flat position by retracting the same into the conveyor belt 44 by the device, not shown.

The lift mechanism 42 is comprised of a frame 47 for holding the transport mechanism 41, a ball screw 48 extending through a portion of the frame 47 for lifting and lowering the same, a pair of guide rails 49, 49 arranged on opposite sides of the ball screw 48 for guiding upward and downward movements of the frame 47, and a lift motor 50 connected to a root-side end of the ball screw 48 for rotating the ball screw 48. The lift motor 50 operates to rotate the ball screw 48 in a normal or reverse direction to thereby lift or lower the frame 47 along the guide rails 49, 49. As the frame 47 is lifted and lowered, the transport mechanism 41 held by the frame 47 and the pallet P placed on the transport mechanism 41 are lifted and lowered.

In the elevating mechanism 22 thus constructed, the conveyor motor 45 of the transport mechanism 41 and the lift motor 50 of the lift mechanism 42 are connected to the controller 24 to have the lifting/lowering operation and transporting operation thereof controlled by the controller 24. As described above, in the transporting operation, the conveyor belt 44 is caused to move in a normal or reverse direction to carry each pallet P between the pallet storage device 21 and the elevating mechanism 22. Further, in the lifting/lowing operation, the upper surface of the conveyor belt 44 is set to the same level as a desired shelf 32 in the pallet storage device 21, while the upper surface of the conveyor belt 44 is selectively set to the same level as one of two upper and lower transport passages 61a, 61b of the pallet guide device 23, described hereinafter, as required.

The pallet guide device 23 is comprised of the above two upper and lower transport passages 61a, 61b arranged on the base 5 of the main block of the apparatus 2, two upper and lower arms 62a, 62b each horizontally extending to advance and retracting to withdraw along the two transport passages 61a, 61b, two upper and lower drive mechanisms 63a, 63b causing the two arms 62a, 62b to extend and retract, respectively. Each of the arms 62a, 62b has an end formed with a hook 64 for engagement with or disengagement from each pallet P. The arms 62a, 62b are extended by the drive mechanism 63a, 63b to cause the hook 64 to engage with an end of the pallet P placed on the transport mechanism 41, and then the arms 62a, 62b are retracted to guide the pallet P along the transport passages 61a, 61b to the pickup position. Both the drive mechanisms 63a, 63b are also connected to the above controller 24 and operated in a manner interlocked with the elevating mechanism 22. It should be noted that the transport passages 61a, 61b are each implemented by a pair of guide rails arranged in parallel with each other for guiding the pallet by moving the same thereon. Therefore, each mounting head 9 can move downward through the upper transport passage 61a to pick up an electronic component transported by the lower transport passage 61b to the pickup position.

Figure 3A:
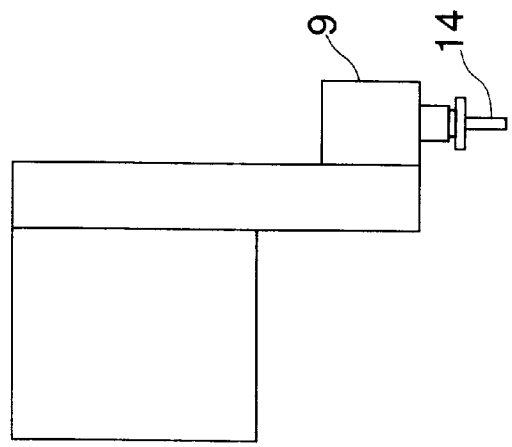
FIGS. 3A and 3B are diagrams which are useful in explaining the manner of suitably using "level 1" and "level 2" in dealing with normal trays.
Figure 3B:
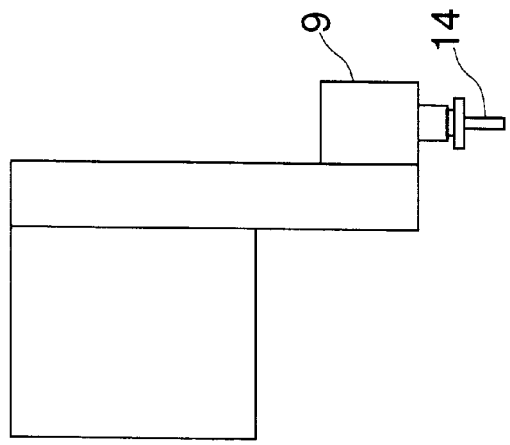

Next, the manner of selectively using one of the above-mentioned two transport passages 61a, 61b will be described with reference to FIGS. 3A and 3B and 4A and 4B. As shown in FIGS. 3A and 3B, the two transport passages 61a, 61b are arranged such that the upper transport passage 61a is located at "level 1" and the lower transport passage 61b is at "level 2". The elevating mechanism 22 brings each pallet P (more strictly, the upper surface of the conveyor belt 44) to the "level 1" or the "level 2", as required. A pallet P on which a thin tray Ta small in height is set is supplied from the "level 1", whereas a pallet P on which a thick tray B large in height is set thereon is supplied from the "level 2". Further, as shown in FIGS. 4A and 4B, in the case of each pallet P carrying thereon trays T in stack, a pallet P having a smaller number of trays T set thereon is supplied from the "level 1", whereas a pallet P having a larger number of trays T set thereon is supplied from the "level 2".

In this case, whether a pallet P should be set on the "level 1" or the "level 2" is determined by using a height sensor (height-detecting device) 25. The height sensor 25 is arranged at a transfer position at which each pallet P is transferred between the pallet storage device 21 and the elevating mechanism 22, in a state held by the elevating mechanism 22. The height sensor 25 detects the height of each tray T or stack of trays T from the top surface of the pallet P passing the transfer position, and based on the detected height of the same, the controller 24 controls the lift mechanism 42 of the elevating mechanism 22.

Now, a sequence of operations of the second electronic component feeder 4 controlled by the controller 24 will be described. First, in response to an instruction signal from the main block of the apparatus, the lift mechanism 42 is driven to move (lift or lower) the transport mechanism 41 to a position of a selected pallet P in the pallet storage device 21. Next, the transport mechanism 41 is driven to draw out the pallet P from the pallet storage device 21, thereby guiding the same onto the transport mechanism 41. When the pallet P is moved onto the transport mechanism 41, the height sensor 25 detects the height of a tray T (or trays T in stack). Then, the lift mechanism 42 is driven again such that if it is determined based on results of detection by the height sensor 25 that the tray T has a small height, the pallet P is moved to the "level 1" by the lift mechanism 42, whereas if it is determined that the tray T has a large height, the pallet P is moved to the "level 2" by the lift mechanism 42.

Then, the pallet guide device 23 is driven. If the pallet P has been guided to the "level 1" based on the above determination, the upper drive mechanism 63a is driven to move the pallet P to the pickup position of the main block of the apparatus 2 along the upper transport passage 61a. On the other hand, if the pallet P has been guided to the "level 2", the lower drive mechanism 63b is driven to move the pallet P to the pickup position of the main block of the apparatus 2 along the lower transport passage 61b.

As described above, small-height trays Ta are guided to the "level 1" and large-height trays Tb are guided to the "level 2" and hence the level of the top surface of each tray T in the pickup position is not adversely affected by the height of the tray T and the difference d in level between the trays in the pickup position is minimized. Therefore, it is only required that the reference level at which the mounting heads 9 are moved is set to the level of the top surface of a tray T or stack of trays T at the highest level among the trays T or stacks of trays T guided to the pickup position, irrespective of the heights of them, whereby the lowering (lifting) stroke of the mounting head 9 for picking up electronics components can be minimized and the difference in stroke between the electronic components can be reduced as well.

Accordingly, since the lowering (lifting) stroke of each mounting head 9a for picking up a small-height tray Ta by vacuum does not become long as in the conventional component-feeding device, it is possible to shorten a time period over which each electronic component is picked up. That is, it is possible to decrease the tact time of mounting electronic components on each circuit board.

It should be noted that although the pallet guide device employed in the present embodiment are provided with two arms and two drive mechanisms in a manner corresponding to the upper and lower transport passages, this is not limitative, but a single arm and a single drive mechanism may be arranged instead of the two arms and two drive mechanisms since pallets P are not guided into the two transport passages at the same time. Further, although in the present embodiment there are provided two upper and lower levels of transport passages for pallets P, there may be provided three, four or more, levels.

As described above, according to the component-feeding device of the invention, each pallet is supplied to the pickup position of the main block of the apparatus at a level dependent on the height of a tray(s) placed thereon. That is if the tray has a large height, it is supplied at a low level, whereas if the tray has a small height, it is supplied at a high level. This reduces the lifting distance of the mounting head, which makes it possible to decrease the tact time of mounting electronic components on circuit boards.

It is further understood by those skilled in the art that the foregoing are preferred embodiments of the invention, and that various changes and modification may be made without departing from the spirit and scope thereof.

What is claimed is:

1. A component-feeding device for an electronic component-mounting apparatus having a main block for carrying out electronic component-pickup and mounting operations, said component-feeding device selectively transporting a plurality of pallets on each of which at least one tray containing a number of electronic components is placed, to a pickup position in said main block for picking up supplied one of said electronic components, the component-feeding device comprising:

vertical transport means for vertically transporting a selected one of said pallets selectively to different levels according to a height of said at least one tray on said selected one of said pallets; and horizontal transport means for horizontally transporting said selected pallet from said vertical transport means to said pickup position.

2. A component-feeding device according to claim 1, wherein said vertical transport means has a vertical transport mechanism for vertically transporting said selected pallet, a controller for controlling operation of said vertical transport mechanism, and a height-detecting device for detecting said height of said at least one tray on said selected pallet from a top surface of said selected pallet, and wherein said controller causes said vertical transport mechanism to operate based on a result of said detection by said height-detecting device.

3. A component-feeding device according to claim 1, wherein said horizontal transport means has a plurality of transport means having respective transport passages corresponding to said different levels.

4. A component-feeding device according to claim 2, including a pallet storage device for storing said plurality of pallets, said pallet storage device having a plurality of shelves arranged in a vertically-spaced manner, said height-detecting device being arranged at a predetermined location on said vertical transport means where said selected pallet passes when said selected pallet is transferred from said pallet storage device to said vertical transport means, for detecting said height of said at least one tray on said selected pallet.

5. A component-feeding device according to claim 4, wherein said vertical transport mechanism comprises a transfer device and a lift mechanism for lifting and lowering said transfer device, said transfer device having a belt conveyor for receiving said selected pallet thereon and horizontally transporting said selected pallet received thereon.

6. A component-feeding device according to claim 5, wherein said belt conveyor has a protruding portion which can be selectively brought to an upright position and a flat retracted position, and wherein when said transfer device pulls said selected pallet out of said pallet storage device, said protruding portion is set to said upright position for engagement with one end of said selected pallet, while when said selected pallet is transferred to said horizontal transport means, said protruding portion is set to said flat retracted position.

7. A component-feeding device according to claim 3, wherein each of said plurality of transport means of said horizontal transport means comprises an arm device for horizontally extending to advance and retracting to withdraw and a drive device for driving said arm device, said arm device having an end formed with a hook for engagement with one end of said selected pallet.

* * * * *